United States Patent
Uejima (10) Patent No.: US 10,454,450 B2
(45) Date of Patent: Oct. 22, 2019

(54) HIGH FREQUENCY SWITCH MODULE

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/669,107

(22) Filed: Aug. 4, 2017

(65) Prior Publication Data
US 2017/0338800 A1 Nov. 23, 2017

Related U.S. Application Data

(63) Continuation of application No. PCT/JP2016/052863, filed on Feb. 1, 2016.

(30) Foreign Application Priority Data

Feb. 5, 2015 (JP) .................. 2015-020841

(51) Int. Cl.
*H03H 9/70* (2006.01)
*H03H 9/64* (2006.01)
(Continued)

(52) U.S. Cl.
CPC ............. *H03H 9/64* (2013.01); *H03H 7/38* (2013.01); *H04B 1/00* (2013.01); *H04B 1/006* (2013.01); *H04B 1/40* (2013.01)

(58) Field of Classification Search
CPC .. H03H 9/64; H03H 7/38; H03H 7/46; H03H 9/72; H04B 1/00; H04B 1/006; H04B 1/40
(Continued)

(56) References Cited

U.S. PATENT DOCUMENTS 6,466,768 B1* 10/2002 Agahi-Kesheh ....... H04B 1/005
  330/133
7,653,360 B2* 1/2010 Uejima .................... H03H 7/46
  361/306.3
(Continued)

FOREIGN PATENT DOCUMENTS

CN 103765774 A 4/2014
JP 2005-260806 A 9/2005
(Continued)

OTHER PUBLICATIONS

International Search Report issued in Application No. PCT/JP2016/052863 dated Mar. 15, 2016.
(Continued)

*Primary Examiner* — Dinh T Le
(74) *Attorney, Agent, or Firm* — Pearne & Gordon LLP (57) ABSTRACT

A high frequency switch module (10) includes a switch device (20), a first inductor (30), and a filter device (40). The switch device (20) includes a shared terminal (P00) and selection target terminals (P02, P03) that are selectively connected to the shared terminal. The filter device (40) includes SAW filters (41, 42) connected to the selection target terminal (P02) and the selection target terminal (P03), respectively. A terminal of the SAW filters (41, 42) on the opposite side to the selection target terminals (P02, P03) is shared and connected to a front-end terminal (Pfe). The first inductor (30) is connected between the selection target terminal (P02) and the selection target terminal (P03).

15 Claims, 4 Drawing Sheets

(51) Int. Cl.
  *H03H 7/38*   (2006.01)
  *H04B 1/00*   (2006.01)
  *H04B 1/40*   (2015.01)

(58) Field of Classification Search
  USPC .................................................. 327/551–559
  See application file for complete search history.

(56) References Cited

U.S. PATENT DOCUMENTS

| | | | | |
|---|---|---|---|---|
| 8,653,975 | B2* | 2/2014 | Deavours | H01Q 1/38 |
| | | | | 340/572.7 |
| 8,736,335 | B2* | 5/2014 | Oshima | H03H 11/16 |
| | | | | 327/231 |
| 9,166,558 | B2* | 10/2015 | Fujiwara | H04B 1/006 |
| 2003/0169129 | A1* | 9/2003 | Takamine | H03H 9/0028 |
| | | | | 333/195 |
| 2012/0300679 | A1 | 11/2012 | Tsutsumi | |
| 2014/0225680 | A1 | 8/2014 | Fujiwara et al. | |
| 2016/0028156 | A1 | 1/2016 | Fujiwara et al. | |

FOREIGN PATENT DOCUMENTS

| | | | |
|---|---|---|---|
| JP | 2006-109084 | A | 4/2006 |
| JP | 2012-244615 | A | 12/2012 |
| WO | 2013/080428 | A1 | 6/2013 |

OTHER PUBLICATIONS

Written Opinion issued in Application No. PCT/JP2016/052863 dated Mar. 15, 2016.

* cited by examiner

HIGH FREQUENCY SWITCH MODULE

This is a continuation of International Application No. PCT/JP2016/052863 filed on Feb. 1, 2016 which claims priority from Japanese Patent Application No. 2015-020841 filed on Feb. 5, 2015. The contents of these applications are incorporated herein by reference in their entireties.

BACKGROUND OF THE DISCLOSURE

Field of the Disclosure

The present disclosure relates to high frequency switch modules used in front-end sections or the like of wireless communication apparatuses.

Description of the Related Art

Nowadays, with the diversification of communication bands, wireless communication apparatuses such as cellular phones and the like include a front-end circuit that can communicate handling a number of communication bands. Such a front-end circuit sends and receives a sending signal and a receiving signal of a plurality of communication bands using an antenna shared by the communication bands, thereby being miniaturized. In order for the antenna to be shared by the plurality of communication bands, a switch module is employed, as disclosed in Patent Document 1, in many cases.

For example, a switch module disclosed in Patent Document 1 includes transmission and reception circuits of a plurality of communication bands and a switch device of SPnT (n is an integer equal to or greater than 2). A shared terminal of the switch device is connected to an antenna, and a plurality of selection target terminals thereof are connected to the transmission and reception circuits of the respective communication bands. With this configuration, any one of the transmission and reception circuits of the plurality of communication bands is switched and connected to the antenna.

Patent Document 1: Japanese Unexamined Patent Application Publication No. 2006-109084

BRIEF SUMMARY OF THE DISCLOSURE

However, a plurality of selection target terminals of a switch device are arranged along one side of a housing of the switch device in many cases, and these selection target terminals are generally arranged close to each other.

This causes a high frequency signal to leak between the selection target terminals in some case. In particular, there arises a problem in the following cases, for example. A frequency of a harmonic of a first communication band signal is in proximity to or overlaps with the fundamental frequency of a second communication band. A first selection target terminal and a second selection target terminal are positioned close to each other, and the first communication band signal is transmitted to the first selection target terminal while a second communication band signal is transmitted to the second selection target terminal.

In this case, harmonic components of the first communication band leak from the first selection target terminal to the second selection target terminal, and are unnecessarily transmitted to a transmission and reception circuit of the second communication band. This causes the degradation in transmission characteristics with respect to the second communication band.

An object of the present disclosure is to provide a high frequency switch module capable of securing a high level of isolation on a selection target terminal side of a switch device.

A high frequency switch module of the present disclosure includes a switch device, a filter device, and a first inductor. The switch device includes a shared terminal, and first and second selection target terminals that are selectively connected to the shared terminal. The filter device is connected to the first selection target terminal and the second selection target terminal, and a terminal of the filter device on the opposite side to the first and second selection target terminals is shared. The first inductor is connected between the first selection target terminal and the second selection target terminal.

In this configuration, the leakage of a high frequency signal between the first selection target terminal and the second selection target terminal is suppressed by parallel resonance of the first inductor and a capacitor generated between the first selection target terminal and the second selection target terminal of the switch device as well as by the filter device connected to both the first selection target terminal and the second selection target terminal. In other words, the isolation characteristics between the first selection target terminal and the second selection target terminal can be enhanced.

It is preferable for the high frequency switch module of the present disclosure to be configured as follows. That is, the high frequency switch module includes a circuit board in or on which the switch device, the filter device, and the first inductor are mounted. A length of a first connection conductor connecting the first selection target terminal to the inductor and a length of a second connection conductor connecting the second selection target terminal to the first inductor are each shorter than a length of a connection conductor connecting the first inductor to the filter device.

In this configuration, the capacitive coupling generated between the first selection target terminal and the second selection target terminal can be suppressed. With this, the leakage of a high frequency signal between the first selection target terminal and the second selection target terminal is further suppressed.

It is preferable in the high frequency switch module of the present disclosure that the first connection conductor and the second connection conductor be arranged at different positions in a plan view of the circuit board.

In this configuration, the capacitive coupling between the first connection conductor and the second connection conductor is further suppressed.

It is preferable in the high frequency switch module of the present disclosure that the switch device include a third selection target terminal between the first selection target terminal and the second selection target terminal.

In this configuration, since the first selection target terminal and the second selection target terminal are distanced from each other, the leakage of a high frequency signal between the first selection target terminal and the second selection target terminal is suppressed.

The high frequency switch module of the present disclosure may be configured as follows. That is, the filter device includes a first filter connected to the first selection target terminal and a second filter connected to the second selection target terminal. A matching inductor is connected between the switch device and the inductor in a transmission line to which the switch device and the first filter are connected.

In this configuration, the impedance of the first selection target terminal of the switch device can be set to appropriate impedance.

Further, the high frequency switch module of the present disclosure may be configured as follows. That is, the filter device includes the first filter connected to the first selection target terminal and the second filter connected to the second selection target terminal. A matching inductor is connected between the switch device and the second filter in a transmission line to which the switch device and the second filter are connected.

In this configuration, the impedance in the case of the switch device being viewed from the second filter can be set to appropriate impedance.

Furthermore, the high frequency switch module of the present disclosure may be configured as follows. That is, the first inductor is a conductor pattern formed in or on the circuit board and having a spiral shape. A ground conductor formed inside the circuit board and positioned near the first inductor has a shape that does not overlap with a center cavity of the spiral shape.

In this configuration, a decrease in a Q-value of the first inductor can be suppressed. With this, the isolation characteristics between the first selection target terminal and the second selection target terminal are further improved.

Moreover, the high frequency switch module of the present disclosure includes a second inductor that is connected to a terminal of the filter device on the opposite side to a terminal thereof to which the first inductor is connected. The second inductor is connected to the first inductor by electromagnetic field coupling.

This configuration makes it possible to use the second inductor for enhancement in the isolation characteristics. Note that the second inductor is a component used for giving other functions (for example, matching between other circuit devices, filter characteristics). Accordingly, the isolation characteristics can be enhanced without additionally using another second inductor.

According to the present disclosure, a high level of isolation can be secured on the selection target terminal side of the switch device. This makes it possible to obtain a high frequency switch module having excellent transmission characteristics.

DETAILED DESCRIPTION OF THE DISCLOSURE

Figure 1:
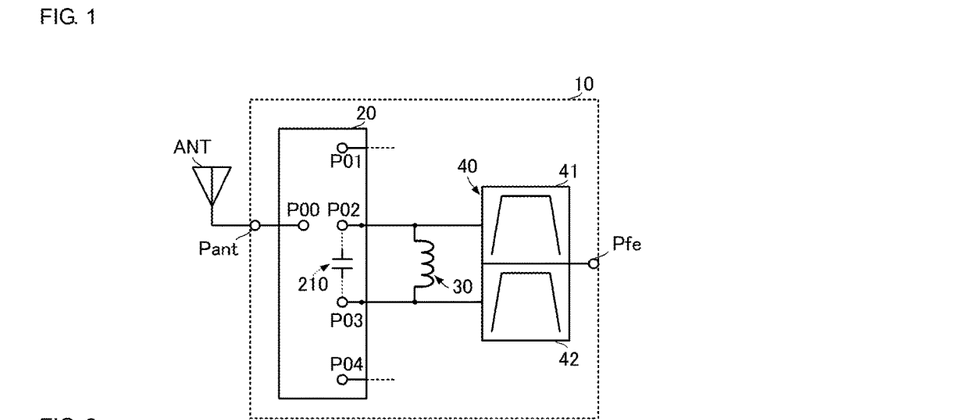
FIG. 1 is a circuit diagram of a high frequency switch module according to a first embodiment of the present disclosure.

A high frequency switch module according to a first embodiment of the present disclosure will be described with reference to the drawings. FIG. 1 is a circuit diagram of a high frequency switch module according to the first embodiment of the present disclosure.

A high frequency switch module 10 according to the present embodiment includes a switch device 20, a first inductor 30, and a filter device 40. The filter device 40 includes a SAW filter 41 configuring a first filter and a SAW filter 42 configuring a second filter. At least one of the first and second filters may be configured of a BAW filter.

The switch device 20 includes a shared terminal P00 and selection target terminals P01, P02, P03, and P04. The switch device 20 is an SPnT switch made of a semiconductor switch. It is sufficient for "n" to be an integer equal to or greater than 2. The shared terminal P00 is selectively connected to any one of the selection target terminals P01, P02, P03, and P04.

The shared terminal P00 is connected to an antenna connection terminal Pant of the high frequency switch module 10. The antenna connection terminal Pant is connected to an antenna ANT.

The selection target terminal P02 is connected to the SAW filter 41. The selection target terminal P03 is connected to the SAW filter 42. The selection target terminal P02 corresponds to a first selection target terminal of the present disclosure, and the selection target terminal P03 corresponds to a second selection target terminal of the present disclosure.

The SAW filter 41 and the SAW filter 42 have mutually different communication bands. In the present embodiment, pass bands of the SAW filter 41 and the SAW filter 42 do not overlap with each other. The SAW filter 41 and the SAW filter 42 are connected to a front-end terminal Pfe of the high frequency switch module 10. In other words, the SAW filter 41 and the SAW filter 42 having a shared terminal on the front-end terminal Pfe side (a terminal on the opposite side to the side connected to the selection target terminals P02 and P03) are connected to the front-end terminal Pfe. This makes it possible to form the SAW filter 41 and SAW filter 42 to be compact.

The first inductor 30 is connected to the selection target terminal P02 and the selection target terminal P03. To be more specific, the first inductor 30 is connected to a transmission line connecting the selection target terminal P02 to the SAW filter 41 and a transmission line connecting the selection target terminal P03 to the SAW filter 42.

The high frequency switch module 10 constituted of the above-discussed circuit configuration is used as described below. In the case where a high frequency signal of a first communication band is received, the shared terminal P00 is connected to the selection target terminal P02. The SAW filter 41 is set so that a frequency band of a receiving signal of the first communication band is included in the pass band thereof. A receiving signal of the first communication band received by the antenna ANT is inputted to the SAW filter 41 through the switch device 20. The receiving signal of the first communication band is filtered by the SAW filter 41 and outputted from the front-end terminal Pfe. In the case where a high frequency signal of a second communication band is received, the shared terminal P00 is connected to the selection target terminal P03. The SAW filter 42 is set so that a frequency band of a receiving signal of the second communication band is included in the pass band thereof. A receiving signal of the second communication band received by the antenna ANT is inputted to the SAW filter 42 through the switch device 20. The receiving signal of the second communication band is filtered by the SAW filter 42 and outputted from the front-end terminal Pfe.

In the above-discussed configuration, a parallel resonance circuit is formed by the first inductor 30 and a capacitor 210 that is generated between the selection target terminal P02 and the selection target terminal P03 inside the switch device 20. A resonant frequency of this parallel resonance circuit is set to a frequency which is a harmonic component of the receiving signal of the first communication band, and which is in proximity to or overlaps with the fundamental frequency of the receiving signal of the second communication band. Employing the above configuration makes it possible to suppress, by the parallel resonance circuit formed of the first inductor 30 and the capacitor 210, the harmonic component of the receiving signal of the first communication band being outputted to the front-end terminal Pfe even if both the SAW filter 41 and the SAW filter 42 are connected to the front-end terminal Pfe. To rephrase, in a transmission path of the receiving signal of the first communication band and a transmission path of the receiving signal of the second communication band, a high level of isolation of the transmission paths on the front-end terminal Pfe side of the switch device 20 can be secured.

Figure 2:
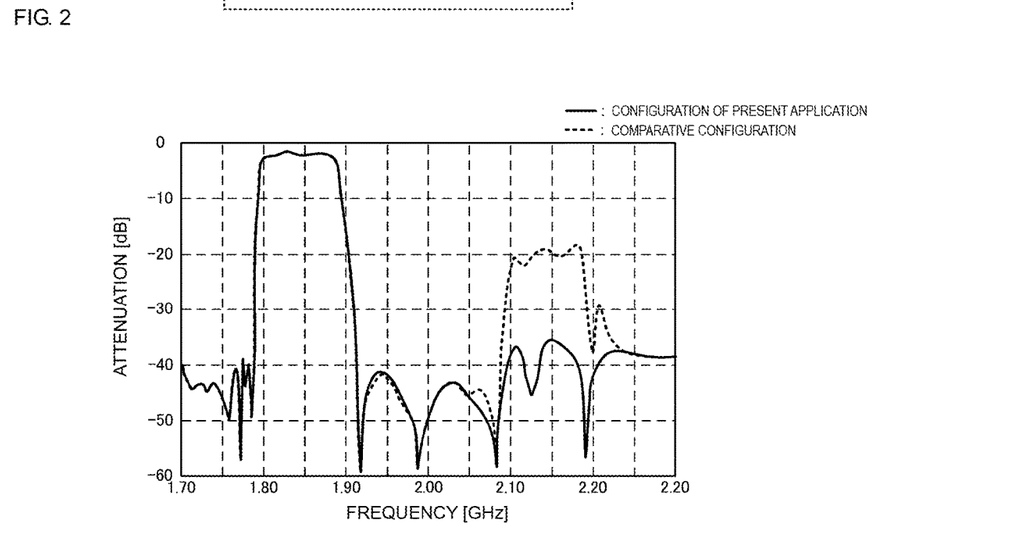
FIG. 2 is a graph illustrating the isolation characteristics of a configuration of the high frequency switch module according to the first embodiment of the present disclosure and isolation characteristics of a comparative configuration.

FIG. 2 is a graph illustrating the isolation characteristics of a configuration of the high frequency switch module according to the first embodiment of the present disclosure and the isolation characteristics of a comparative configuration. The comparative configuration refers to a configuration in which the first inductor 30 and the filter device 40 are omitted in the high frequency switch module 10 according to the present embodiment, that is, a configuration in which receiving signals of the communication bands are switched only by the switch device 20.

As shown in FIG. 2, a harmonic component leaks in the comparative configuration. However, using the configuration of the high frequency switch module 10 of the present embodiment makes it possible to suppress the harmonic component of the receiving signal of the first communication band being outputted from the front-end terminal Pfe without increasing the insertion loss of the fundamental frequency.

As described above, by using the high frequency switch module 10 of the present embodiment, a high level of isolation on the selection target terminal side of the switch device can be secured, and a high frequency switch module excellent in transmission characteristics can be realized while being miniaturized in a simplified configuration.

Figure 3:
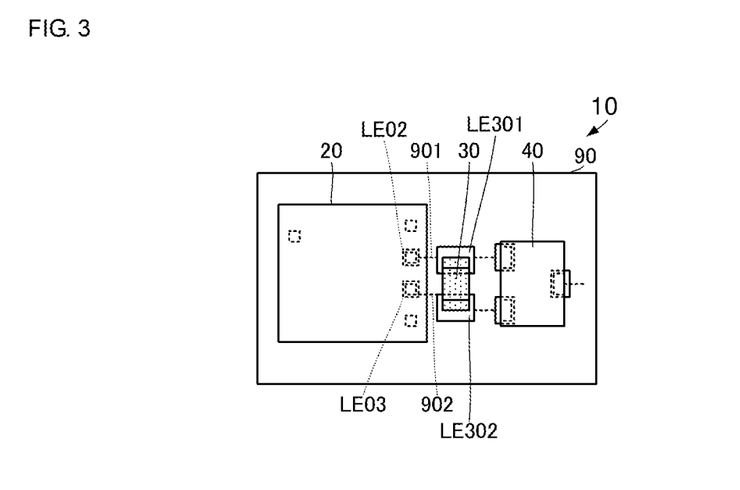
FIG. 3 is a plan view of the high frequency switch module according to the first embodiment of the present disclosure.

The high frequency switch module 10 configured as discussed above can be given with a structure as described below. FIG. 3 is a plan view of the high frequency switch module according to the first embodiment of the present disclosure. Note that FIG. 3 illustrates only a configuration that characterizes the high frequency switch module 10 in the present application.

The high frequency switch module 10 includes a multilayer body 90, the mount-type switch device 20, the mount-type first inductor 30, and the mount-type filter device 40. The multilayer body 90 is produced by laminating a dielectric substrate in or on which a conductor pattern is formed at a predetermined position. A circuit board is configured of the multilayer body 90 having two rectangular principal surfaces opposing each other and four side surfaces respectively connected to both the principal surfaces. The mount-type switch device 20, the mount-type first inductor 30, and the mount-type filter device 40 are mounted on a surface of the multilayer body 90, that is, mounted on one of the principal surfaces of the circuit board.

A land conductor LE301 on which one of outer conductors of the first inductor 30 is mounted and a land conductor LE02 on which the selection target terminal P02 of the switch device 20 is mounted are connected with a connection conductor 901 formed in the multilayer body 90. A land conductor LE302 on which the other of the outer conductors of the first inductor 30 is mounted and a land conductor LE03 on which the selection target terminal P03 of the switch device 20 is mounted are connected with a connection conductor 902 formed in the multilayer body 90.

The first inductor 30 is mounted near the selection target terminals P02 and P03 of the switch device 20. It is attempted to make a distance between the connection conductor 901 and the connection conductor 902 be shortest as much as possible. To be more specific, respective parts of the connection conductors 901 and 902 linearly extend in parallel to each other toward the filter device 40 from electrodes connected to the selection target terminals P02 and P03 of the switch device 20 provided on the surface of the multilayer body 90. To each of the parts of the connection conductors 901 and 902 that are linear and parallel to each other, an inductor chip configuring the first inductor 30 is electrically connected. An orientation in which outer electrodes of the inductor chip are connected and a direction in which the above parts of the connection conductors 901 and 902 extend are orthogonal to each other.

With this configuration, the capacitive coupling of the connection conductors 901 and 902 can be suppressed. This makes it possible to further enhance the isolation on the selection target terminal side of the switch device 20.

Figure 4A:
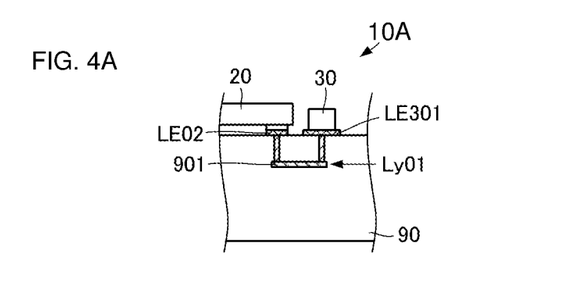
FIGS. 4A and 4B include partial cross-sectional views illustrating a structure of a high frequency switch module according to a second embodiment of the present disclosure.
Figure 4B:
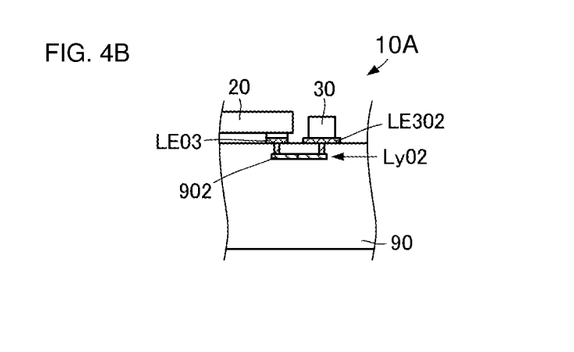

Next, a high frequency switch module according to a second embodiment of the present disclosure will be described with reference to the drawings. FIGS. 4A and 4B include partial cross-sectional views illustrating a structure of a high frequency switch module according to the second embodiment of the present disclosure.

A high frequency switch module 10A of the present embodiment differs from the high frequency switch module 10 of the first embodiment in terms of the structures of the connection conductors 901 and 902.

A portion of the connection conductor 901 extending in a direction orthogonal to a lamination direction of the multilayer body 90 is disposed at a position corresponding to a dielectric layer Ly01 of the multilayer body 90. A portion of the connection conductor 902 extending in a direction orthogonal to the lamination direction of the multilayer body 90 is disposed at a position corresponding to a dielectric layer Ly02 of the multilayer body 90.

With this configuration, the portion of the connection conductor 901 extending in the direction orthogonal to the lamination direction of the multilayer body 90 and the portion of the connection conductor 902 extending in the direction orthogonal to the lamination direction of the multilayer body 90 are disposed at different positions in a plan view of the multilayer body 90 when seen from the surface thereof as well as in a plan view of the multilayer body 90 when seen from the side surface thereof. This makes it possible to further suppress the capacitive coupling of the connection conductor 901 and connection conductor 902.

Accordingly, the isolation on the selection target terminal side of the switch device 20 can be further enhanced.

Figure 5:
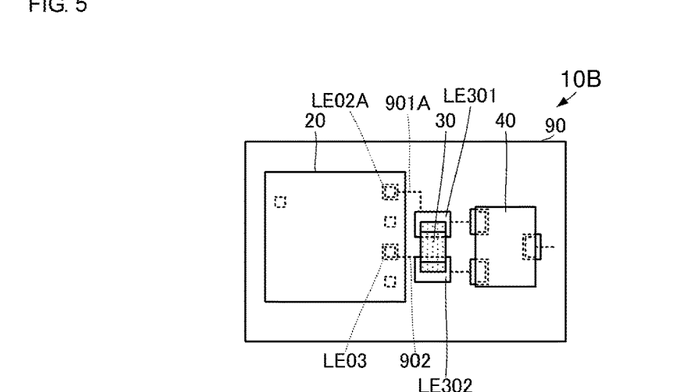
FIG. 5 is a plan view illustrating a structure of a high frequency switch module according to a third embodiment of the present disclosure.

Next, a high frequency switch module according to a third embodiment of the present disclosure will be described with reference to the drawings. FIG. 5 is a plan view illustrating a structure of a high frequency switch module according to the third embodiment of the present disclosure.

A high frequency switch module 10B of the present embodiment differs from the high frequency switch module 10 of the first embodiment in a connection configuration of the switch device 20, the first inductor 30, and the filter device 40.

In the high frequency switch module 10B of the present embodiment, the selection target terminal P01 of the switch device 20 is connected to the SAW filter 41 of the filter device 40. In the present embodiment, the selection target terminal P01 corresponds to the first selection target terminal of the present disclosure. The selection target terminal P02 corresponds to a third selection target terminal of the present disclosure.

With this configuration, the selection target terminals that are connected to the SAW filters 41, 42 and may have a problem of high frequency signal leakage are distanced from each other, and another selection target terminal is disposed between the above selection target terminals. This suppresses the capacitive coupling between the selection target terminals respectively connected to the SAW filters 41 and 42, and allows a connection conductor 901A connecting the selection target terminal P01 to the SAW filter 41 (one of the outer conductors of the first inductor 30) and the connection conductor 902 connecting the selection target terminal P03 to the SAW filter 42 (the other of the outer conductors of the first inductor 30) to be distanced from each other, thereby making it possible to suppress the capacitive coupling of the connection conductor 901A and the connection conductor 902. Accordingly, the isolation on the selection target terminal side of the switch device 20 can be further enhanced.

Figure 6:
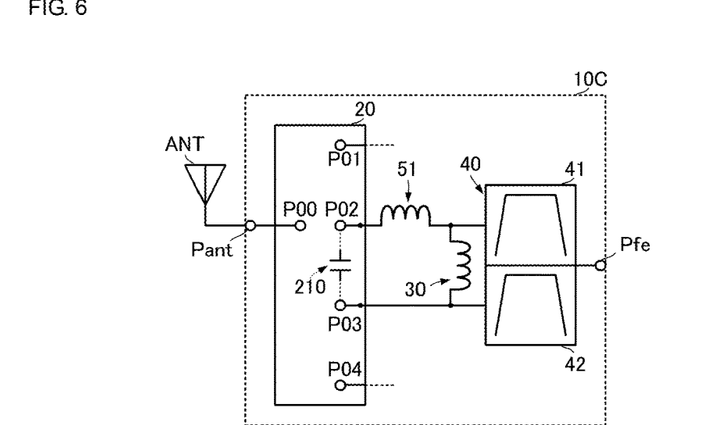
FIG. 6 is a circuit diagram of a high frequency switch module according to a fourth embodiment of the present disclosure.

Next, a high frequency switch module according to a fourth embodiment of the present disclosure will be described with reference to the drawings. FIG. 6 is a circuit diagram of a high frequency switch module according to the fourth embodiment of the present disclosure.

A high frequency switch module 10C of the present embodiment is such that a matching inductor 51 is added to the high frequency switch module 10 of the first embodiment.

The matching inductor 51 is connected between the selection target terminal P02 and one of the outer conductors of the first inductor 30 in the transmission line connecting the selection target terminal P02 to the SAW filter 41.

With the above configuration, the impedance in the case of the switch device 20 being viewed from the first inductor 30 and the SAW filter 41 can be shifted from being capacitive toward being inductive. For example, in the case where a frequency of a high frequency signal transmitted by the SAW filter 41 is higher than a frequency of a high frequency signal transmitted by the SAW filter 42, the impedance in the case of the selection target terminal P02 being viewed is capacitive to a higher degree than the impedance in the case of the selection target terminal P03 being viewed. By the high frequency switch module 10C of the present embodiment being provided with the matching inductor 51, the impedance in the case of the selection target terminal P02 being viewed and the impedance in the case of the selection target terminal P03 being viewed can be made to be approximately the same at the frequencies of the high frequency signals being transmitted. This makes it possible to transmit, with low loss, the high frequency signals respectively transmitted by the SAW filters 41 and 42 while securing the isolation on the selection target terminal side of the switch device 20.

Figure 7:
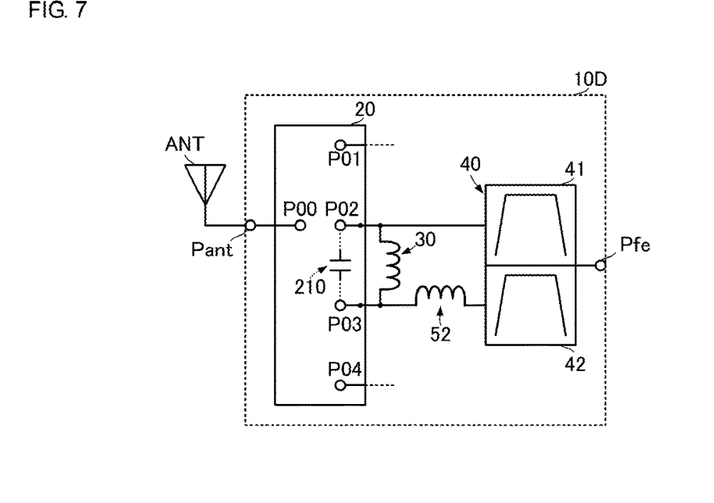
FIG. 7 is a circuit diagram of a high frequency switch module according to a fifth embodiment of the present disclosure.

Next, a high frequency switch module according to a fifth embodiment of the present disclosure will be described with reference to the drawings. FIG. 7 is a circuit diagram of a high frequency switch module according to the fifth embodiment of the present disclosure.

A high frequency switch module 10D of the present embodiment is such that a matching inductor 52 is added to the high frequency switch module 10 of the first embodiment.

The matching inductor 52 is connected between the other of the outer conductors of the first inductor 30 and the SAW filter 42 in the transmission line connecting the selection target terminal P03 to the SAW filter 42.

With the above configuration, the impedance in the case of the SAW filter 42 being viewed from the first inductor 30 and the switch device 20 can be shifted from being capacitive toward being inductive. For example, in the case where a frequency of a high frequency signal transmitted by the SAW filter 42 is lower than a frequency of a high frequency signal transmitted by the SAW filter 41, the impedance in the case of the SAW filter 42 being viewed is capacitive to a higher degree than the impedance in the case of the SAW filter 41 being viewed. By the high frequency switch module 10D of the present embodiment being provided with the matching inductor 52, the impedance in the case of the SAW filter 41 being viewed and the impedance in the case of the SAW filter 42 being viewed can be made to be approximately the same at the frequencies of the high frequency signals being transmitted. This makes it possible to transmit, with low loss, the high frequency signals respectively transmitted by the SAW filters 41 and 42 while securing the isolation on the selection target terminal side of the switch device 20.

Figure 8:
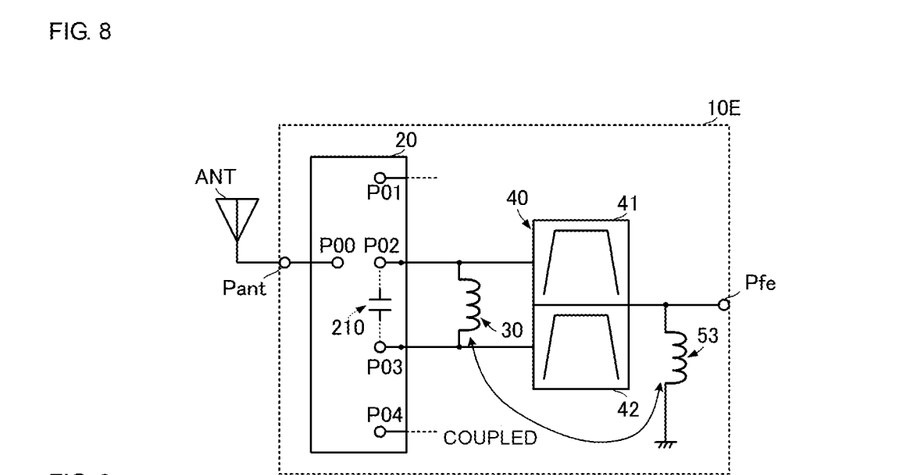
FIG. 8 is a circuit diagram of a high frequency switch module according to a sixth embodiment of the present disclosure.

Next, a high frequency switch module according to a sixth embodiment of the present disclosure will be described with reference to the drawings. FIG. 8 is a circuit diagram of a high frequency switch module according to the sixth embodiment of the present disclosure.

A high frequency switch module 10E of the present embodiment is such that a characteristic adjusting inductor 53 configuring a second inductor is added to the high frequency switch module 10 of the first embodiment.

The characteristic adjusting inductor 53 is connected between a ground and a transmission line connecting the filter device 40 to the front-end terminal Pfe. The characteristic adjusting inductor 53 is used for impedance matching between the filter device 40 and a subsequent circuit (for example, an LNA) connected to the front-end terminal Pfe, or the like.

The characteristic adjusting inductor 53 and the first inductor 30 are connected by electromagnetic field coupling. With this configuration, apparent inductance of the first inductor 30 can be changed by the electromagnetic field coupling without changing a physical size of the first inductor 30. This makes it possible to obtain appropriate isolation characteristics even if a shape of the first inductor 30 cannot be structurally changed. For example, the high frequency switch module 10E can be formed to be more compact while the isolation characteristics being maintained.

The second inductor (characteristic adjusting inductor 53) coupled to the first inductor 30 may be connected between the ground and a terminal of the filter device 40 on the side connected to the switch device 20. That is, the second inductor may be an inductor for impedance matching between the switch device 20 and the filter device 40.

Figure 9:
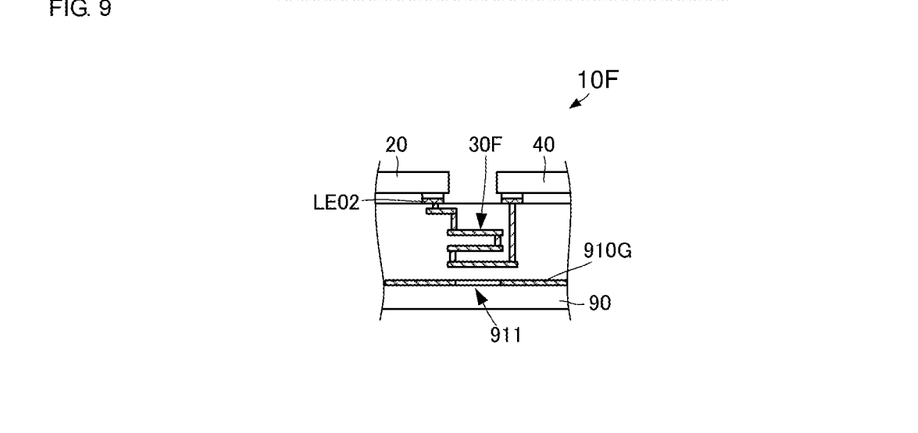
FIG. 9 is a partial cross-sectional view illustrating a structure of a high frequency switch module according to a seventh embodiment of the present disclosure.

Next, a high frequency switch module according to a seventh embodiment of the present disclosure will be described with reference to the drawings. FIG. 9 is a partial cross-sectional view illustrating a structure of a high frequency switch module according to the seventh embodiment of the present disclosure.

A high frequency switch module 10F of the present embodiment differs from the high frequency switch module 10 of the first embodiment in a point that a first inductor 30F is formed inside the multilayer body 90.

The first inductor 30F is formed in a spiral shape with a conductor pattern which is formed inside the multilayer body 90. In this case, a winding axis of the first inductor 30F is parallel to the lamination direction.

Although an inner ground conductor 910G of the multilayer body 90 is formed substantially across the whole surface in a plan view of the multilayer body 90, it has an opening section 911.

The opening section 911 overlaps with a center cavity of the spiral shape of the first inductor 30F in a plan view of the multilayer body 90.

With the above-discussed configuration, the shape of the high frequency switch module 10F in a plan view can be made smaller in size than the shape of the high frequency switch module 10 in a plan view. In addition, because a magnetic field generated by the first inductor 30E is not obstructed by the inner ground conductor 910G, a decrease in a Q-value of the first inductor 30F can be suppressed. This makes it possible to further enhance the isolation on the selection target terminal side of the switch device 20.

10, 10A, 10B, 10C, 10D, 10E, 10F HIGH FREQUENCY SWITCH MODULE
20 SWITCH DEVICE
30, 30F FIRST INDUCTOR
40 FILTER DEVICE
41, 42 SAW FILTER
51, 52 MATCHING INDUCTOR
53 SECOND INDUCTOR
90 MULTILAYER BODY
901, 902 CONNECTION CONDUCTOR
910G INNER GROUND CONDUCTOR
911 OPENING SECTION

The invention claimed is:

1. A high frequency switch module comprising:
a switch device including a shared terminal and first and second selection target terminals selectively connected to the shared terminal;
a first filter connected to the first selection target terminal;
a second filter connected to the second selection target terminal; and
a first inductor connected to a first transmission line and a second transmission line, the first transmission line connecting the first selection target terminal and the first filter, the second transmission line connecting the second selection target terminal and the second filter, the first inductor forming a parallel resonance circuit with a capacitance generated between the first selection target terminal and the second selection target terminal.

2. The frequency switch module according to claim 1, wherein a length of a first connection conductor connecting the first selection target terminal and the first inductor is shorter than a length of a connection conductor connecting the first inductor and the first filter, and a length of a second connection conductor connecting the second selection target terminal and the first inductor is shorter than a length of a connection conductor connecting the first inductor and the second filter.

3. The frequency switch module according to claim 2, further comprising:
a circuit board in or on which the switch device, the first filter the second filter, and the first inductor are mounted,
wherein the first connection conductor and the second connection conductor are arranged at different positions in a plan view of the circuit board.

4. The frequency switch module according to claim 1, wherein the switch device includes a third selection target terminal between the first selection target terminal and the second selection target terminal.

5. The frequency switch module according to claim 1, wherein an output terminal of the first filter and an output terminal of the second filter are shared.

6. The frequency switch module according to claim 1, further comprising:
a matching inductor connected between the switch device and the second filter in the second transmission line.

7. The frequency switch module according to claim 2, further comprising:
a matching inductor connected between the switch device and the first inductor in the first transmission line.

8. The frequency switch module according to claim 1, further comprising:
a matching inductor connected between the switch device and the second filter in the second transmission line.

9. The frequency switch module according to claim 2, further comprising:
a matching inductor connected between the switch device and the second filter in the second transmission line.

10. The frequency switch module according to claim 5, further comprising:
a matching inductor connected between the switch device and the first inductor in the first transmission line.

11. The frequency switch module according to claim 1, wherein the parallel resonance circuit suppresses a harmonic component of a receiving signal of a communication band outputted to an output terminal of the first filter and an output terminal of the second filter.

12. The frequency switch module according to claim 1, wherein the parallel resonance circuit suppresses leakage of a high frequency signal between the first selection target terminal and the second selection target terminal.

13. A high frequency switch module comprising:
a switch device including a shared terminal and first and second selection target terminals selectively connected to the shared terminal;
a first filter connected to the first selection target terminal;
a second filter connected to the second selection target terminal;
a first inductor connected between the first selection target terminal and the second selection target terminal; and
a circuit board in or on which the switch device, the first filter, the second filter, and the first inductor are mounted,
wherein the first inductor is a conductor pattern provided in or on the circuit board and having a spiral shape, and
a ground conductor provided inside the circuit board and positioned near the first inductor has a shape not overlapping with a center cavity of the spiral shape.

14. The frequency switch module according to claim 5, further comprising:
- a second inductor connected to the output terminal of the first filter and ground,
- wherein the second inductor is connected to the first inductor by electromagnetic field coupling.

15. The frequency switch module according to claim 2, wherein the switch device includes a third selection target terminal between the first selection target terminal and the second selection target terminal.

* * * * *